(12) United States Patent
Cao et al.

(10) Patent No.: US 11,158,663 B2
(45) Date of Patent: Oct. 26, 2021

(54) IMAGE SENSOR WITH LARGE DYNAMIC RANGE

(71) Applicant: Shenzhen Genorivision Technology Co., Ltd., Shenzhen (CN)

(72) Inventors: Peiyan Cao, Shenzhen (CN); Yurun Liu, Shenzhen (CN)

(73) Assignee: Shenzhen Genorivision Technology Co., Ltd., Shenzhen (CN)

( * ) Notice: Subject to any disclaimer, the term of this patent is extended or adjusted under 35 U.S.C. 154(b) by 377 days.

(21) Appl. No.: 16/117,910

(22) Filed: Aug. 30, 2018

(65) Prior Publication Data

US 2018/0374889 A1 Dec. 27, 2018

Related U.S. Application Data

(63) Continuation of application No. PCT/CN2016/086507, filed on Jun. 21, 2016.

(51) Int. Cl.
| | |
|---|---|
| *H01L 27/146* | (2006.01) |
| *H01L 31/107* | (2006.01) |
| *H04B 10/69* | (2013.01) |
| *H04N 5/235* | (2006.01) |
| *G01J 3/28* | (2006.01) |
| *G02B 23/12* | (2006.01) |

(52) U.S. Cl.
CPC ...... *H01L 27/14643* (2013.01); *H01L 27/146* (2013.01); *H01L 27/14609* (2013.01); *H01L 27/14634* (2013.01); *H01L 31/107* (2013.01); *H04B 10/6911* (2013.01); *H04N 5/2355* (2013.01); *G01J 3/2823* (2013.01); *G02B 23/12* (2013.01); *H01L 27/14636* (2013.01)

(58) Field of Classification Search
CPC ............. H01L 27/14643; H01L 27/146; H01L 27/14609; H01L 27/14634; H01L 31/07; H01L 27/14636; G01J 3/2823; G02B 23/12
See application file for complete search history.

(56) References Cited

U.S. PATENT DOCUMENTS

| | | | |
|---|---|---|---|
| 6,870,239 B1 | 3/2005 | Clark | |
| 2007/0034776 A1* | 2/2007 | Weber | ................... G01S 7/4802 |
| | | | 250/206 |

(Continued)

FOREIGN PATENT DOCUMENTS

| | | |
|---|---|---|
| CN | 103148950 A | 6/2013 |
| CN | 104576667 A | 4/2015 |

(Continued)

*Primary Examiner* — Georgia Y Epps
*Assistant Examiner* — Don J Williams
(74) *Attorney, Agent, or Firm* — IPro, PLLC; Qian Gu

(57) ABSTRACT

Disclosed herein is a system comprising: an avalanche photodiode (APD); a bias source configured to supply a reverse bias to the APD; a current meter configured to measure electric current through the APD; a controller configured to reduce the reverse bias to a value below a breakdown voltage of the APD from a value above the breakdown voltage when an intensity of light incident on the APD is above a threshold, and configured to determine the intensity of the light above the threshold based on the electric current through the APD when the reverse bias is below the breakdown voltage.

10 Claims, 14 Drawing Sheets

(56) References Cited

U.S. PATENT DOCUMENTS

| | | | |
|---|---|---|---|
| 2010/0148040 A1* | 6/2010 | Sanfilippo | H01L 31/1075 250/214.1 |
| 2010/0245809 A1* | 9/2010 | Andreou | H01L 27/14603 356/222 |
| 2011/0240865 A1 | 10/2011 | Frach et al. | |
| 2012/0063789 A1* | 3/2012 | Yuan | H01L 31/02027 398/202 |
| 2012/0205522 A1 | 8/2012 | Richardson et al. | |
| 2014/0233027 A1* | 8/2014 | Sutin | G01J 3/2823 356/303 |
| 2015/0115131 A1* | 4/2015 | Webster | H01L 27/14603 250/208.1 |

FOREIGN PATENT DOCUMENTS

| | | |
|---|---|---|
| CN | 104779259 A | 7/2015 |
| CN | 104779317 A | 7/2015 |
| CN | 105374834 A | 3/2016 |
| WO | 2016003451 A1 | 1/2016 |

* cited by examiner

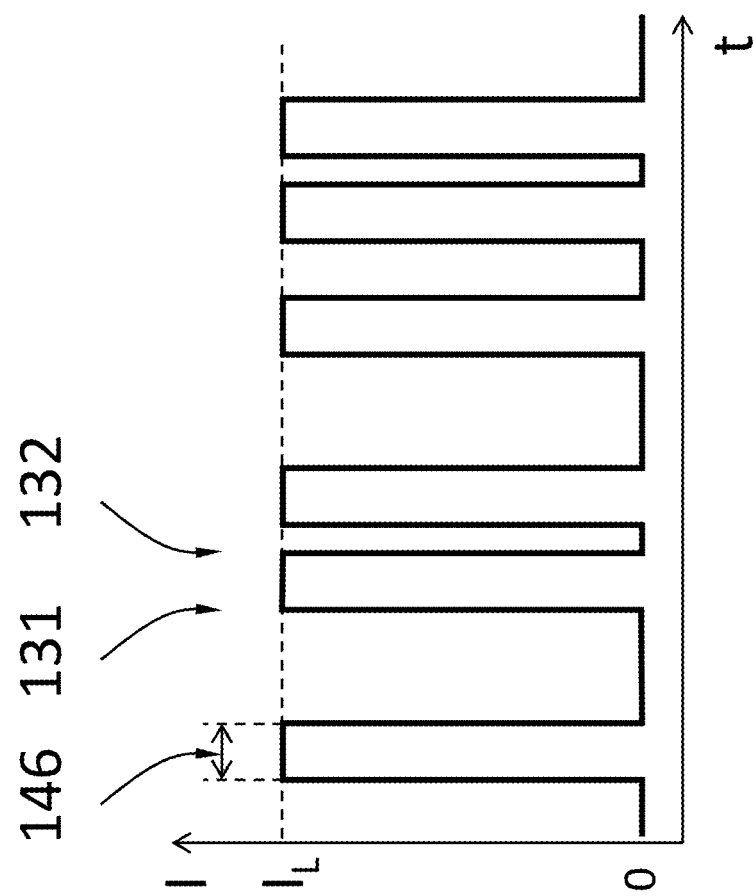

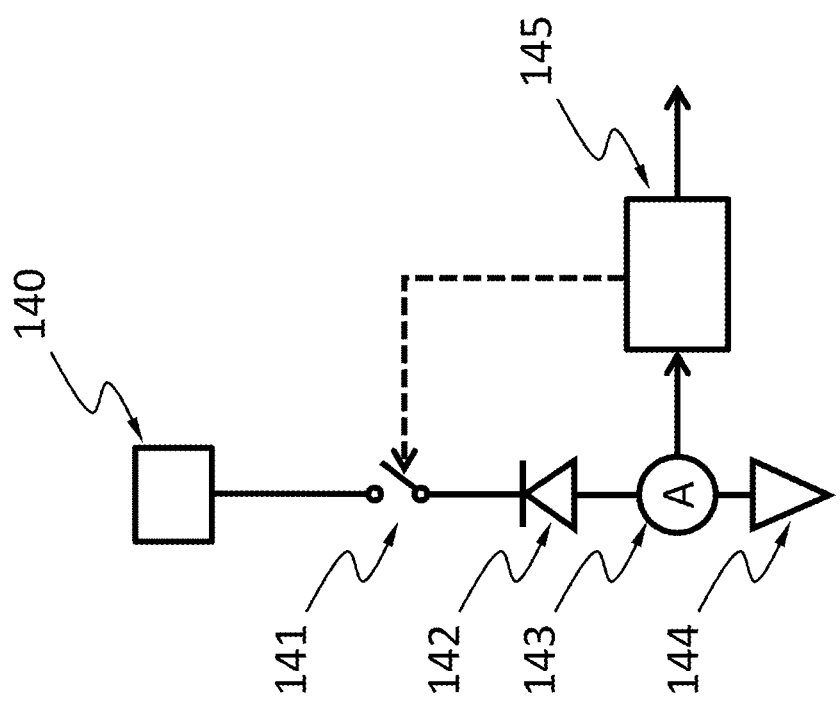

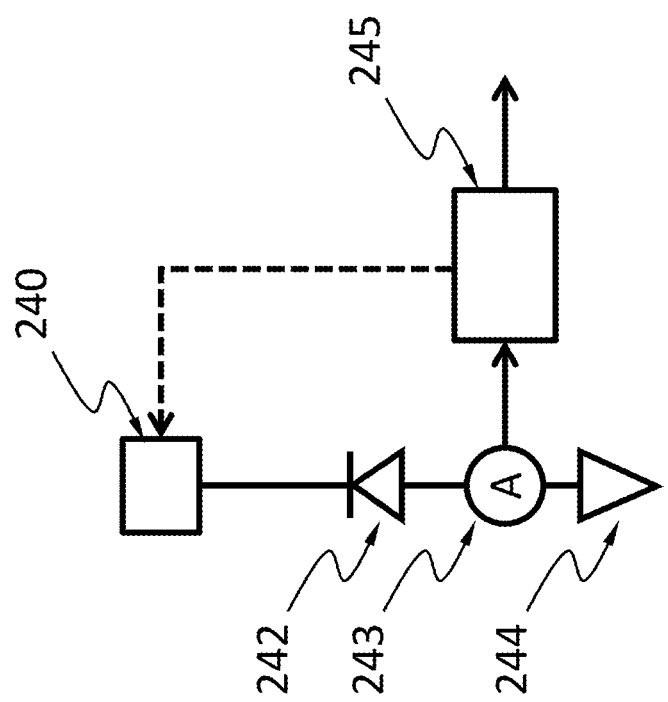

IMAGE SENSOR WITH LARGE DYNAMIC RANGE

TECHNICAL FIELD

The disclosure herein relates to an image sensor, particularly relates an image sensor with large dynamic range.

BACKGROUND

An image sensor or imaging sensor is a sensor that can detect a spatial intensity distribution of a radiation. An image sensor usually represents the detected image by electrical signals. Image sensors based on semiconductor devices may be classified into several types: semiconductor charge-coupled devices (CCD), complementary metal-oxide-semiconductor (CMOS), N-type metal-oxide-semiconductor (NMOS). A CMOS image sensor is a type of active pixel sensor made using the CMOS semiconductor process. Light incident on a pixel in the CMOS image sensor is converted into an electric voltage. The electric voltage is digitized into a discrete value that represents the intensity of the light incident on that pixel. An active-pixel sensor (APS) is an image sensor that includes pixels with a photodetector and an active amplifier. A CCD image sensor includes a capacitor in a pixel. When light incidents on the pixel, the light generates electrical charges and the charges are stored on the capacitor. The stored charges are converted to an electric voltage and the electrical voltage is digitized into a discrete value that represents the intensity of the light incident on that pixel.

Dynamic range of an image sensor is the range between the smallest and largest light intensity the image sensor can detect. Namely, the image sensor cannot distinguish different light intensities outside the dynamic range.

SUMMARY

Disclosed herein is a system comprising: an avalanche photodiode (APD); a bias source configured to supply a reverse bias to the APD; a current meter configured to measure electric current through the APD; a controller configured to reduce the reverse bias to a value below a breakdown voltage of the APD from a value above the breakdown voltage when an intensity of light incident on the APD is above a threshold, and configured to determine the intensity of the light above the threshold based on the electric current through the APD when the reverse bias is below the breakdown voltage.

According to an embodiment, the controller is configured to quench the APD after the controller detects a rising edge in the electric current, when the reverse bias is above the breakdown voltage.

According to an embodiment, the controller is configured to increase the reverse bias to above the breakdown voltage after quenching the APD.

According to an embodiment, the controller is configured to determine the intensity of light incident on the APD based on a number of pulses in the electric current in a given amount of time, when the reverse bias is above the breakdown voltage.

Disclosed herein is an image sensor comprising: an array of APDs; an electronic system configured to individually control reverse biases on the APDs based on intensities of light incident on the APDs.

According to an embodiment, the electronic system is configured to set the reverse biases differently to different APDs in the array.

According to an embodiment, the APDs are configured such that, at a given time, a first one of the APDs operates in a linear mode and a second one of the APDs operates in a Geiger mode.

According to an embodiment, the electronic system is configured to determine the intensities of light incident on the APDs operating in a linear mode and the intensities of light incident on the APDs operating in a Geiger mode.

According to an embodiment, the electronic system is configured to cause APDs in the array that are exposed to intensities of light above a saturation intensity of these APDs to operate in a linear mode; wherein the electronic system is configured to cause APDs in the array that are exposed to intensities of light below the saturation intensity of these APDs to operate in a Geiger mode.

According to an embodiment, the electronic system is configured to individually switch the APDs in the array between operating in a linear mode and operating in a Geiger mode based on intensities of light incident on the APDs.

According to an embodiment, the image sensor is configured to output a representation of intensities of the light incident on the APDs, without passing operating modes of the APDs to downstream circuits.

According to an embodiment, the APDs are in or on a first substrate and the electronic system is in or on a second substrate; wherein the first substrate and the second substrate are bonded together.

According to an embodiment, the image sensor further comprises transmission lines in the first substrate or in the second substrate.

According to an embodiment, the image sensor further comprises vias that are configured to electrically connect the APDs and the electronic system.

Disclosed herein is a telescopic sight comprising the image sensor disclosed herein.

Disclosed herein is a night vision goggle comprising the image sensor disclosed herein.

Disclosed herein is a telescope comprising the image sensor disclosed herein.

Disclosed herein is a spectrometer comprising the image sensor disclosed herein.

Disclosed herein is a vehicle comprising the image sensor disclosed herein, wherein the vehicle is a land vehicle, a space vehicle, an aerial vehicle, or a water surface vehicle.

Disclosed herein is a method of using an APD, comprising: (a) applying a first reverse bias above a breakdown voltage of the APD to the APD; (b) measuring a first intensity of light incident on the APD; (c) determining whether the first intensity is above a first threshold; if the first intensity is not above the first threshold, repeating (a)-(c); if the first intensity is above the first threshold: (d) applying a second reverse bias below the breakdown voltage to the APD; (e) measuring a second intensity of light incident on the APD; (f) determining whether the first intensity is below a second threshold; if the second intensity is not below the second threshold, repeating (d)-(f); if the second intensity is below the first threshold, performing (a)-(c).

According to an embodiment, measuring a first intensity comprises counting a number of current pulses through the APD in a giving amount of time.

According to an embodiment, measuring a second intensity comprises measuring an electric current in the APD.

According to an embodiment, the first threshold is a saturation intensity of the APD.

According to an embodiment, the first and second thresholds are the same.

BRIEF DESCRIPTION OF FIGURES

FIG. 1C schematically shows the electric current through a SPAD as a function of time.

FIG. 1D schematically shows a circuit comprising a SPAD.

FIG. 2 shows a system comprising an APD, according to an embodiment.

DETAILED DESCRIPTION

A single-photon avalanche diode (SPAD) (also known as a Geiger-mode APD or G-APD) is an avalanche photodiode (APD) working under a reverse bias above the breakdown voltage. Here the word "above" means that absolute value of the reverse bias is greater than the absolute value of the breakdown voltage. When a photon incidents on a SPAD, it may generate charge carriers (electrons and holes). Some of the charge carriers are accelerated by an electric field in the SPAD and may trigger an avalanche current by impact ionization. Impact ionization is a process in a material by which one energetic charge carrier can lose energy by the creation of other charge carriers. For example, in semiconductors, an electron (or hole) with enough kinetic energy can knock a bound electron out of its bound state (in the valence band) and promote it to a state in the conduction band, creating an electron-hole pair. A SPAD may be used to detect low intensity light (e.g., down to a single photon) and to signal the arrival times of the photons with a jitter of a few tens of picoseconds.

A SPAD may be in a form of a p-n junction under a reverse bias (i.e., the p-type region of the p-n junction is biased at a lower electric potential than the n-type region) above the breakdown voltage of the p-n junction. The breakdown voltage of a p-n junction is a reverse bias, above which exponential increase in the electric current in the p-n junction occurs.

Figure 1A:
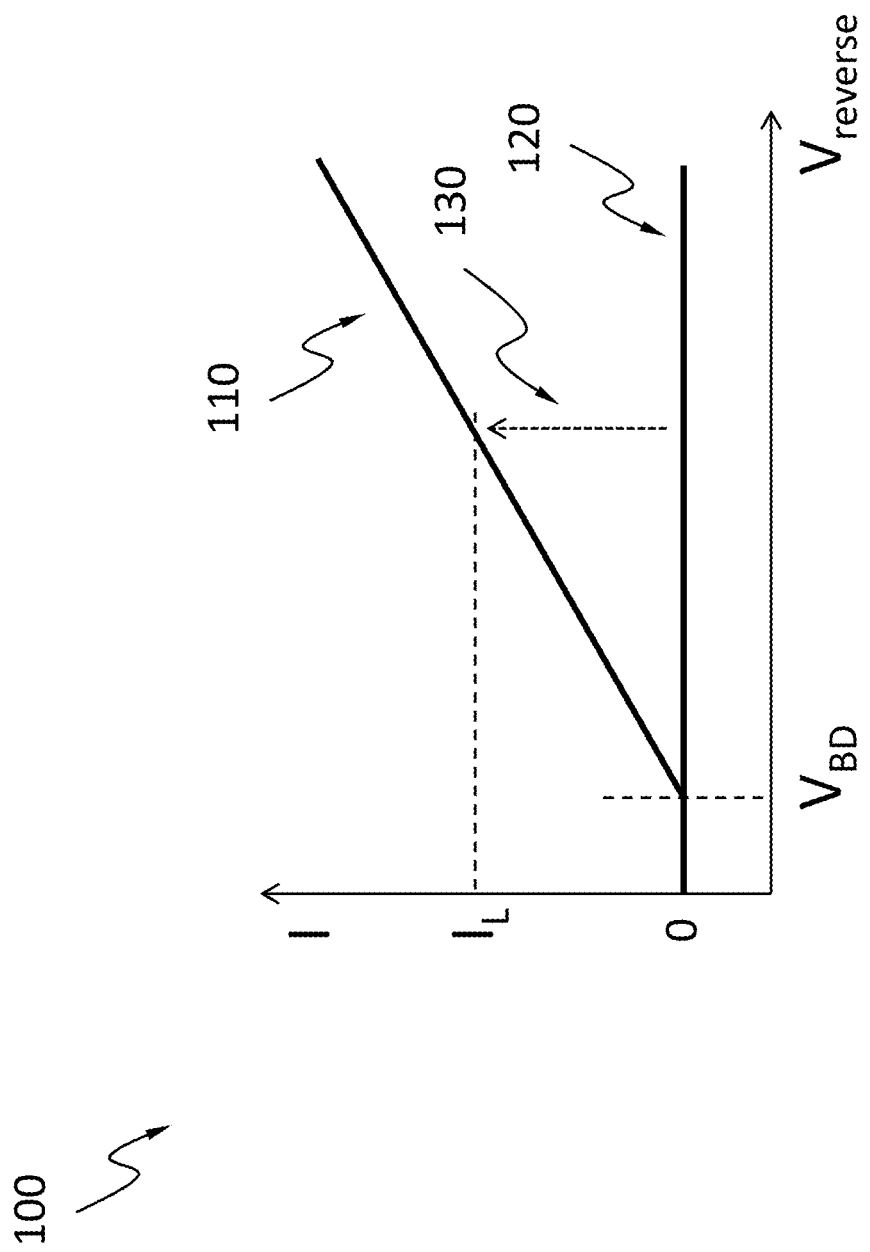
FIG. 1A schematically shows the current-voltage characteristics of an APD in the linear mode, and in the Geiger mode.

FIG. 1A schematically shows the current-voltage characteristics 100 of an APD in the linear mode, and in the Geiger mode (i.e., when the APD is a SPAD). The APD may have a bifurcation of the current-voltage characteristics 100 above the breakdown voltage $V_{BD}$ (i.e., a SPAD). When the reverse biased is above $V_{BD}$, both electrons and holes may cause significant ionization, and the avalanche is self-sustaining. When the avalanche is triggered (e.g., by an incident photon) at a reverse biased is above $V_{BD}$, the avalanche current is sustained ("on-branch" 110); when the avalanche is not triggered at a reverse biased is above $V_{BD}$, very little electric current flows through ("off-branch" 120). At a reverse bias above $V_{BD}$, when an incident photon triggers avalanche in the APD, the current-voltage characteristics 100 of the APD transitions (as indicated by the arrow 130) from the off-branch 120 to the on-branch 110. This transition manifests as a sharp increase of electric current flowing through the APD, from essentially zero to a finite value of $I_L$. This transition is similar to the mechanism behind the Geiger counter. Therefore, at a reverse bias above $V_{BD}$, an APD is operating in the "Geiger mode." An APD working at a reverse bias below the breakdown voltage is operating in the linear mode because the electric current in the APD is proportional to the intensity of the light incident on the APD.

Figure 1B:
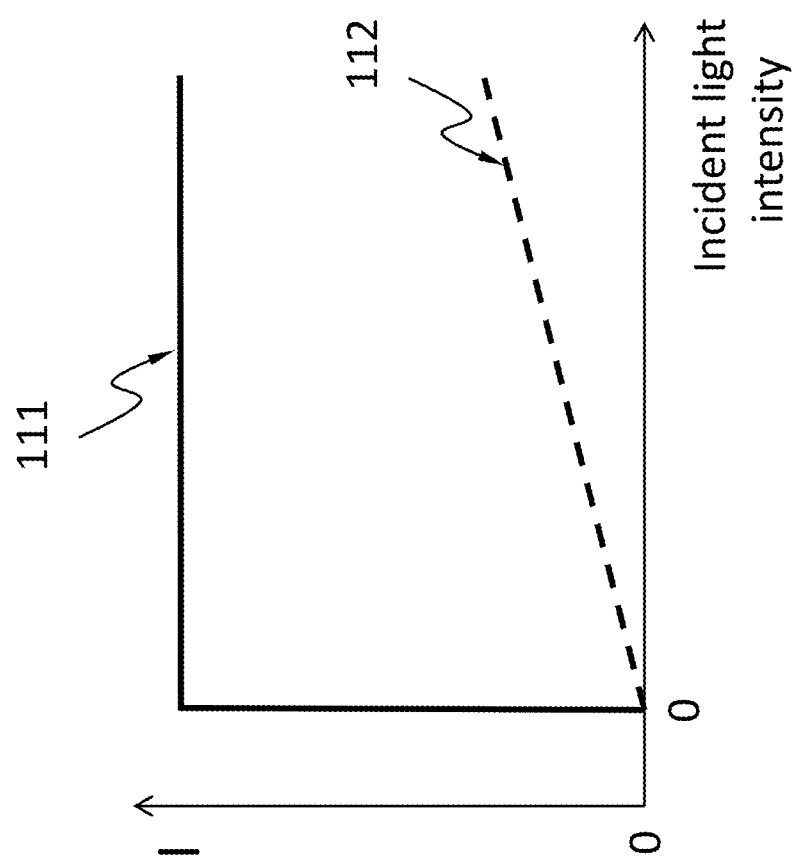
FIG. 1B schematically shows the electric current in an APD as a function of the intensity of light incident on the APD when the APD is in the linear mode, and a function of the intensity of light incident on the APD when the APD is in the Geiger mode.

FIG. 1B schematically shows the electric current in an APD as a function 112 of the intensity of light incident on the APD when the APD is in the linear mode, and a function 111 of the intensity of light incident on the APD when the APD is in the Geiger mode (i.e., when the APD is a SPAD). In the Geiger mode, the current shows a very sharp increase with the intensity of the light and then saturation. In the linear mode, the current is essentially proportional to the intensity of the light.

FIG. 1C schematically shows the electric current through a SPAD as a function of time. When light incidents on the SPAD and triggers the avalanche, a sharp rising edge 131 of the electric current-time (I-t) curve appears. The electric current quickly increases from essentially zero to a finite value of $I_L$. The electric current maintains at the finite value of $I_L$, until the reverse bias on the SPAD is reset to essentially zero. Resetting the reverse bias on the SPAD to essentially zero may be referred to as "quenching" the SPAD. Quenching the SPAD manifests as a falling edge 132 in the I-t curve.

FIG. 1D schematically shows a circuit comprising a SPAD 142 (i.e., an APD operating in the Geiger mode). The circuit is configured to quench the SPAD 142. The bias source 140 supplies the reverse bias to the SPAD 142 through a switch 141. The electric current through the SPAD 142 is measured by a current meter 143. The SPAD 142 is connected to ground 144 through the current meter 143. The electric current measured by the current meter 143 is transmitted to a controller 145. The controller 145 is configured to quench the SPAD 142. In an example, the controller 145 quenches the SPAD 142 by opening the switch 141, thereby disconnecting the bias source 140 from the SPAD, after the controller 145 detects a rising edge (e.g., rising edge 131) in the electric current measured by the current meter 143; the controller 145 closes the switch 141 after quenching the SPAD 142, after which the SPAD is ready to detect the next incident photon. The dynamic range of the device shown in FIG. 1D is relatively small. When the average time interval between two consecutive photons incident on the SPAD 142 is the same as or shorter than the sum of the time 146 (see FIG. 1C) it takes the controller 145 to quench the SPAD 142 (e.g., by opening the switch 141) after sensing a rising edge 131, and the time it takes the controller 145 to restore the reverse bias (e.g., by closing the switch 141) after the controller 145 quenches the SPAD 142, the SPAD 142 is saturated. Namely, SPAD 142 cannot distinguish different intensities of the incident light when the SPAD 142 is saturated. When the SPAD 142 is not saturated, the intensity of the incident light can be obtained from the number of pulses, the number of rising edges, or the number of fall edges in a given amount of time.

FIG. 2 shows a system comprising an APD 242, according to an embodiment. The bias source 240 supplies the reverse bias to the APD 242. The electric current through the APD 242 is measured by a current meter 243. The APD 242 is connected to ground 244 through the current meter 243. The electric current measured by the current meter 243 is transmitted to a controller 245. The controller 245 controls the reverse bias applied to the APD 242. When the reverse bias applied to the APD 242 is above $V_{BD}$, i.e., when the APD 242 is a SPAD 242, the controller 245 is configured to quench the SPAD 242. In an example, the controller 145 quenches the SPAD 242 by disconnecting the SPAD 242 from the bias source 240 or setting the reverse bias to essentially zero (e.g., below 0.1 V), after the controller 245 detects a rising edge in the electric current measured by the current meter 243; the controller 245 changes the reverse bias back above the breakdown voltage $V_{BD}$ after quenching the SPAD 242, after which the SPAD 242 is ready to detect the next incident photon. The controller 245 is also configured to sense the intensity of the incident light on the SPAD 242. When the intensity is above a threshold (e.g., when the intensity saturates the SPAD 242), the controller 245 reduces the reverse bias on the SPAD 242 to a smaller value below $V_{BD}$, i.e., when the SPAD 242 is the APD 242 operating in the linear mode. Here the phrase "reduce the reverse bias" means reducing the absolute value of the reverse bias; the word "smaller" as used with respect to the reverse bias means that the absolute value of the reverse bias is smaller. The controller 245 is configured to sense the intensity of the incident light on the APD 242 in the linear mode. When the intensity is below a threshold (e.g., when the intensity does not cause saturation if the reverse bias increases above $V_{BD}$), the controller 245 increases the reverse bias on the APD 242 to a larger value above $V_{BD}$ (i.e., now the APD 242 is the SPAD 242).

Figure 3:
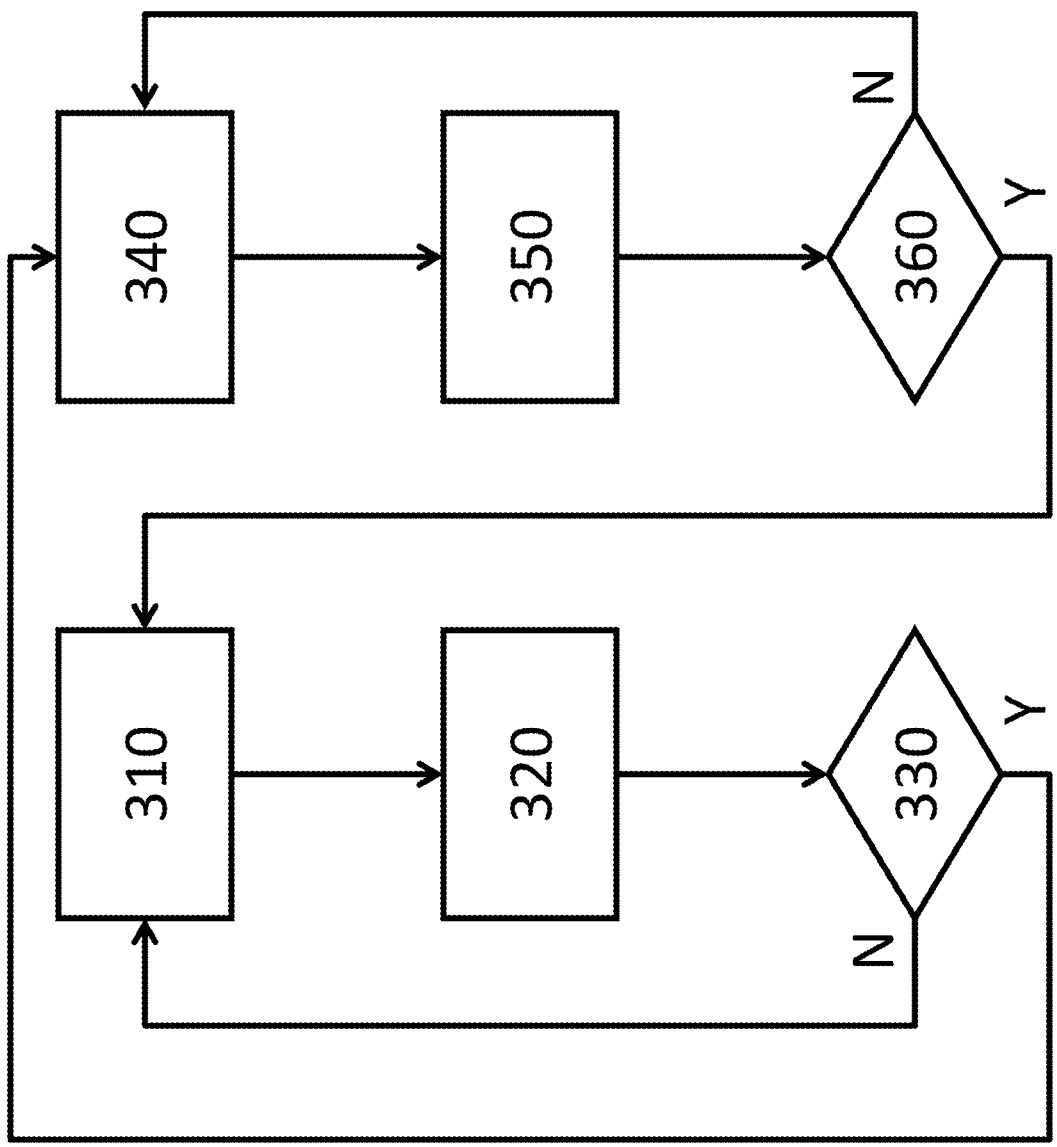
FIG. 3 schematically shows a flow chart for a method of using an APD, according to an embodiment.

FIG. 3 schematically shows a flow chart for a method of using an APD, according to an embodiment. In procedure 310, apply a reverse bias V1 above the breakdown voltage $V_{BD}$ of the APD to the APD. In procedure 320, measure the intensity of light incident on the APD. For example, when the APD is a SPAD at V1, the intensity may be measured by counting the number of current pulses through the APD in a giving amount of time. In procedure 330, determine whether the intensity measured in procedure 320 is above a first threshold. For example, the first threshold may be an intensity that causes saturation of the SPAD. If the intensity is not above the first threshold, the flow goes back to procedure 310. If the intensity is above the first threshold, the flow goes to procedure 340. In procedure 340, apply a reverse bias V2 below the breakdown voltage $V_{BD}$ to the APD. In procedure 350, measure the intensity of light incident on the APD. For example, when the APD is not a SPAD at V2, the intensity may be measured by measuring the electric current through the APD. In procedure 360, determine whether the intensity measured in procedure 350 is below a second threshold. For example, the first threshold may be an intensity that does not cause saturation of the SPAD at the reverse bias V1. If the intensity is not below the second threshold, the flow goes back to procedure 340. If the intensity is below the second threshold, the flow goes to procedure 310. The first and second thresholds may be the same or different.

Figure 4:
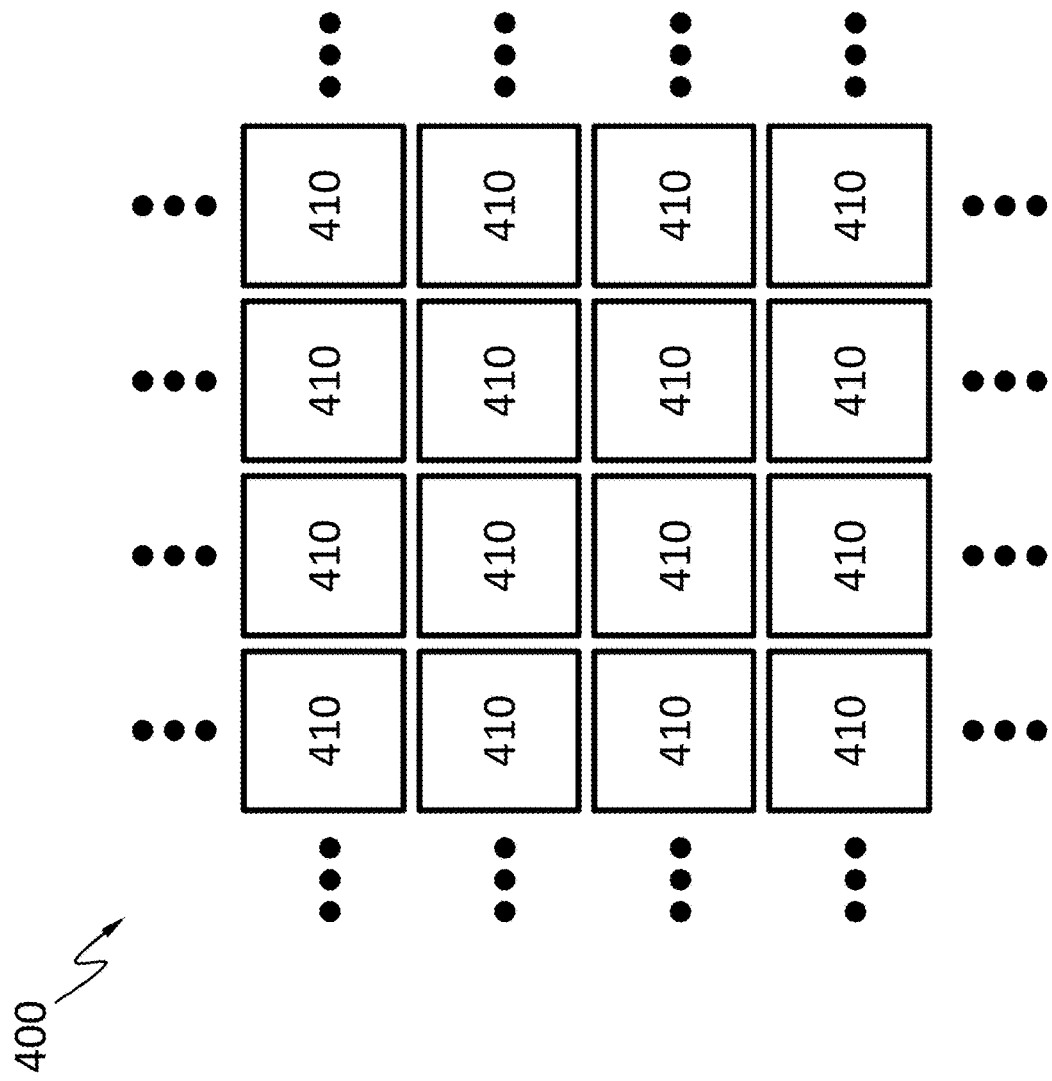
FIG. 4 schematically shows a top view of an image sensor comprising an array of APDs.

FIG. 4 schematically shows a top view of an image sensor 400 comprising an array 410 of APDs. The image sensor 400 has an electronic system (including e.g., one or more of the controller 245) that is configured to individually control the reverse biases on the APDs based on the intensities of light incident on the APDs. The electronic system may be configured to set the reverse biases differently to different APDs in the array 410. At a given time, some of the APDs in the array 410 may be operating in the linear mode, and some may be operating in the Geiger mode (i.e., being SPADs). The electronic system may be configured to determine the intensities of light incident on the APDs no matter the APDs operate in the linear mode or the Geiger mode. The image sensor 400 thus has the combined dynamic ranges of the APDs operating in the linear mode and the APDs operating in the Geiger mode. When the image sensor 400 is exposed to a scene that has a portion of high light intensity that would saturate APDs operating in the Geiger mode, those APDs in the array exposed to that portion can operate in the linear mode and the rest of the APDs can operate in the Geiger mode. The intensity of incident light above which an APD operating in the Geiger mode is saturated is called the "saturation intensity" of the APD. The APDs in the array can be controlled using the method illustrated in FIG. 3. The electronic system can individually switch the APDs in the array between operating in the linear mode and operating in the Geiger mode as the scene changes, based on the intensities of light incident on the APDs. The image sensor 400 can be configured to output a representation of the intensities of the light incident on the APDs, without having to pass the operating modes of the APDs to downstream circuits. The image sensor 400 may be configured to sense a scene of infrared light, visible light, ultraviolet light, or X-ray.

Figure 5A:
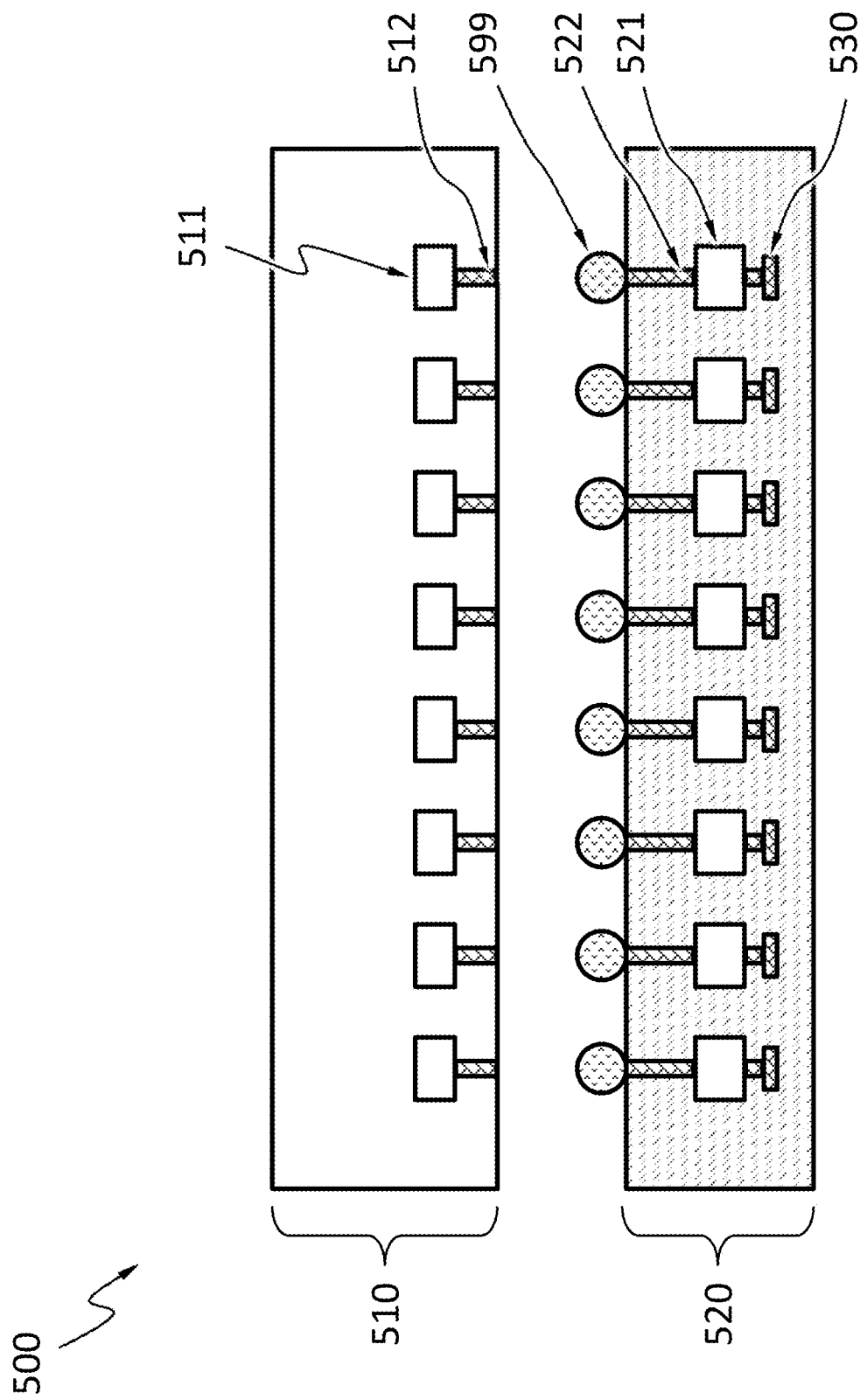
FIG. 5A and FIG. 5B schematically show a cross-sectional view of an image sensor comprising a plurality of APDs.
Figure 5B:
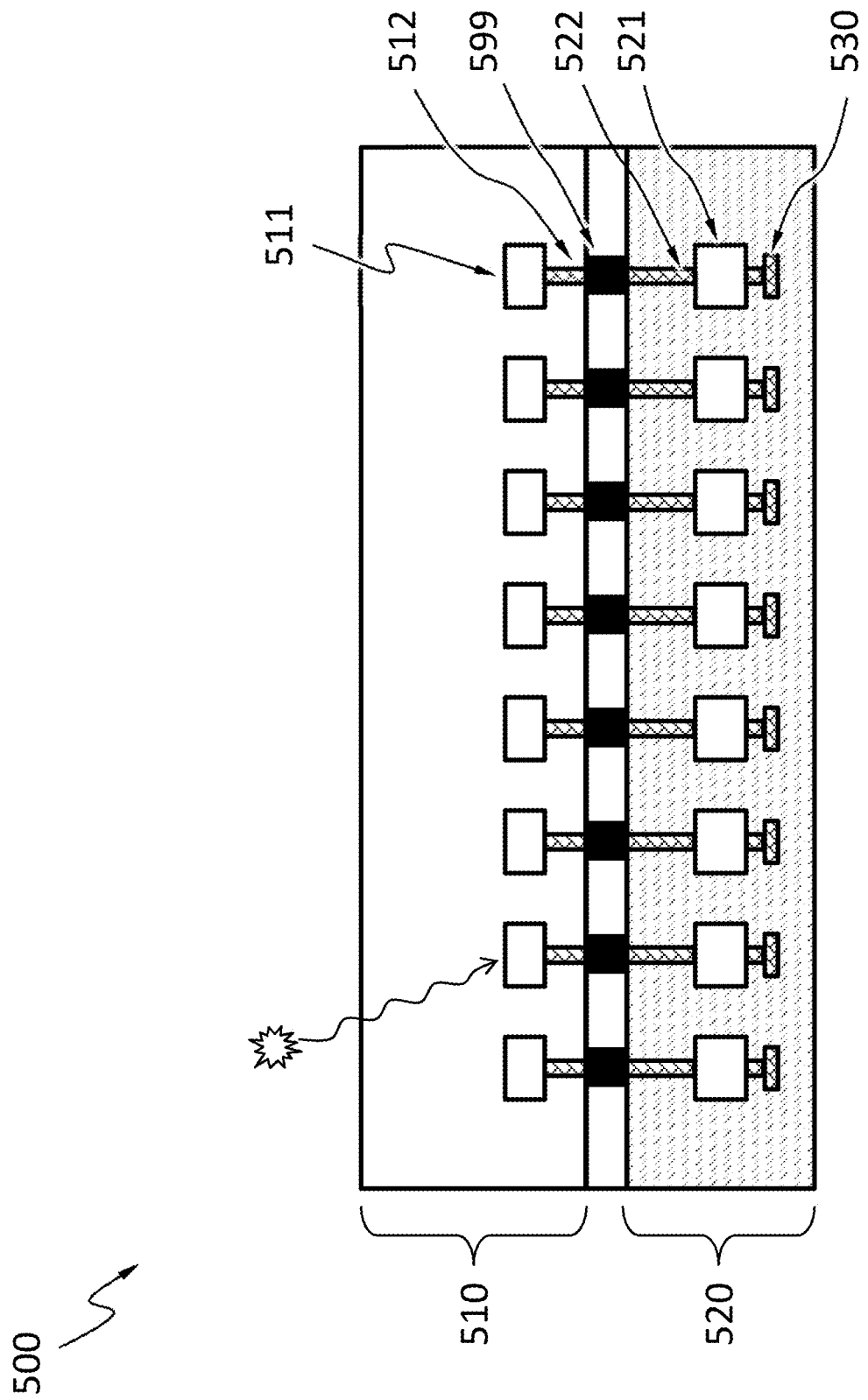

FIG. 5A and FIG. 5B schematically show a cross-sectional view of an image sensor 500 comprising a plurality of APDs 511. The APDs 511 may be fabricated in a substrate 510 (e.g., a semiconductor wafer). One or more vias 512 may be present in the substrate 510 and the vias 512 electrically connect the APDs 511 to a surface of the substrate 510. Alternatively, the APDs 511 may be disposed on the surface of the substrate 510 such that electrical contacts on the APDs 511 are exposed to the surface. Electronic systems 521 that communicate and/or control the APDs 511 may be fabricated in another substrate 520. Electronic systems 521 may include controllers, bias sources, switches, current meters, memories, amplifiers or other suitable components. Some components of the electronic systems 521 may be fabricated in the substrate 510. Electronic systems 521 may be configured to use the APDs 511 using the method illustrated in FIG. 3. One or more vias 522 may be present and electrically connect the electronic systems 521 to a surface of the substrate 520. Alternatively, the electronic systems 521 may be disposed at the surface of the substrate 520 such that electrical contacts on the electronic systems 521 are exposed to the surface. The substrate 520 may include transmission lines 530 configured to transmit data, power and/or signals to and from the electronic systems 521, and through which to and from the APDs 511. The substrates 510 and 520 may be bonded by a suitable substrate bonding technique, such as flip chip bonding or direct bonding.

As shown in FIG. 5A and FIG. 5B, flip chip bonding uses solder bumps 599 deposited onto the surface of either one of the substrates 510 and 520. Either of the substrates 510 and 520 is flipped over and the APDs 511 and the electronic systems 521 are aligned (e.g., through the vias 512, 522 or both). The substrates 510 and 520 are brought into contact. The solder bumps 599 may be melted to electrically connect the APDs 511 and the electronic systems 521. Any void space among the solder bumps 599 may be filled with an insulating material.

Direct bonding is a wafer bonding process without any additional intermediate layers (e.g., solder bumps). The bonding process is based on chemical bonds between two surfaces. Direct bonding may be at elevated temperature but not necessarily so.

Figure 6A:
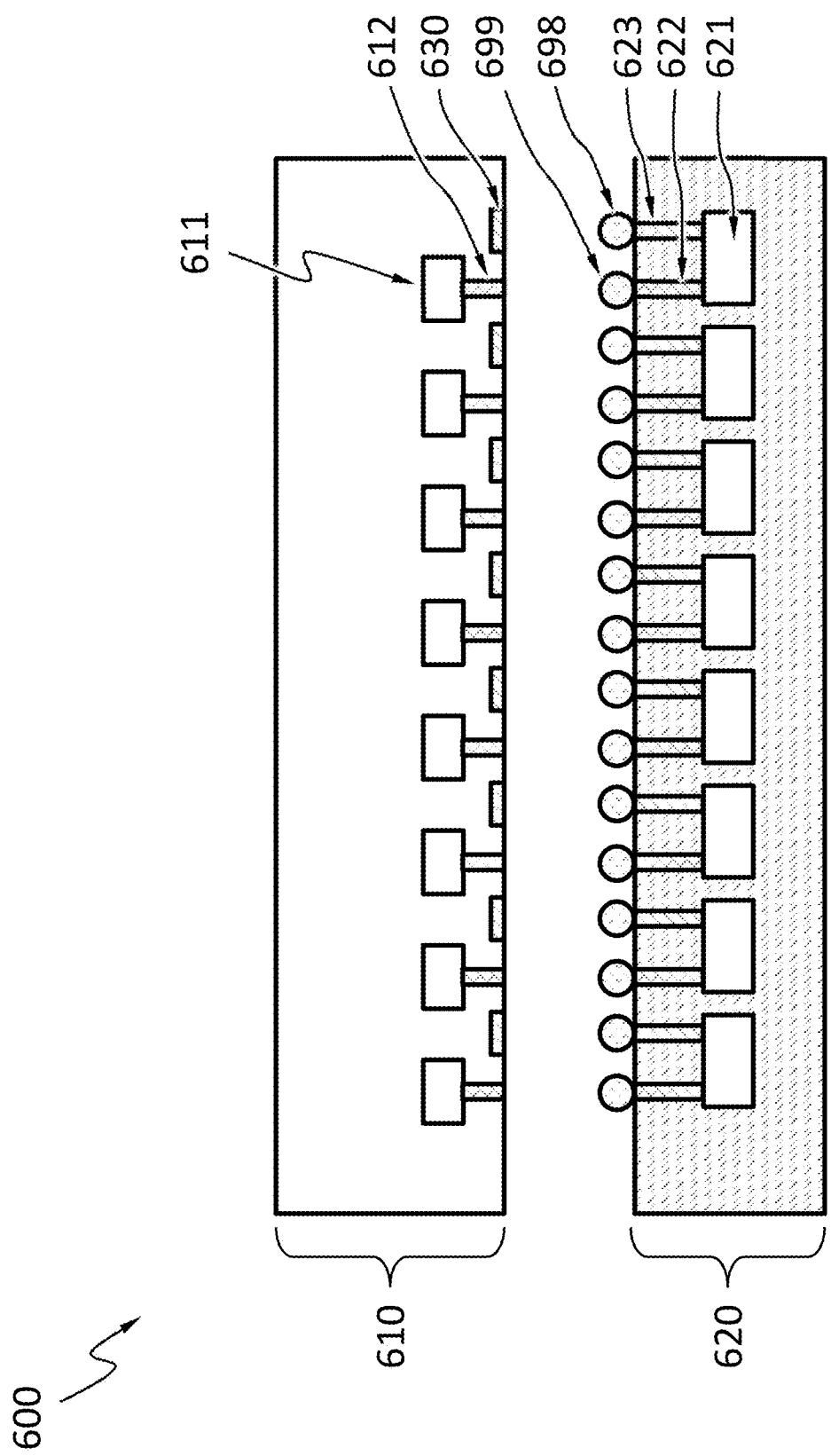
FIG. 6A and FIG. 6B schematically show a cross-sectional view of an image sensor comprising a plurality of APDs.
Figure 6B:
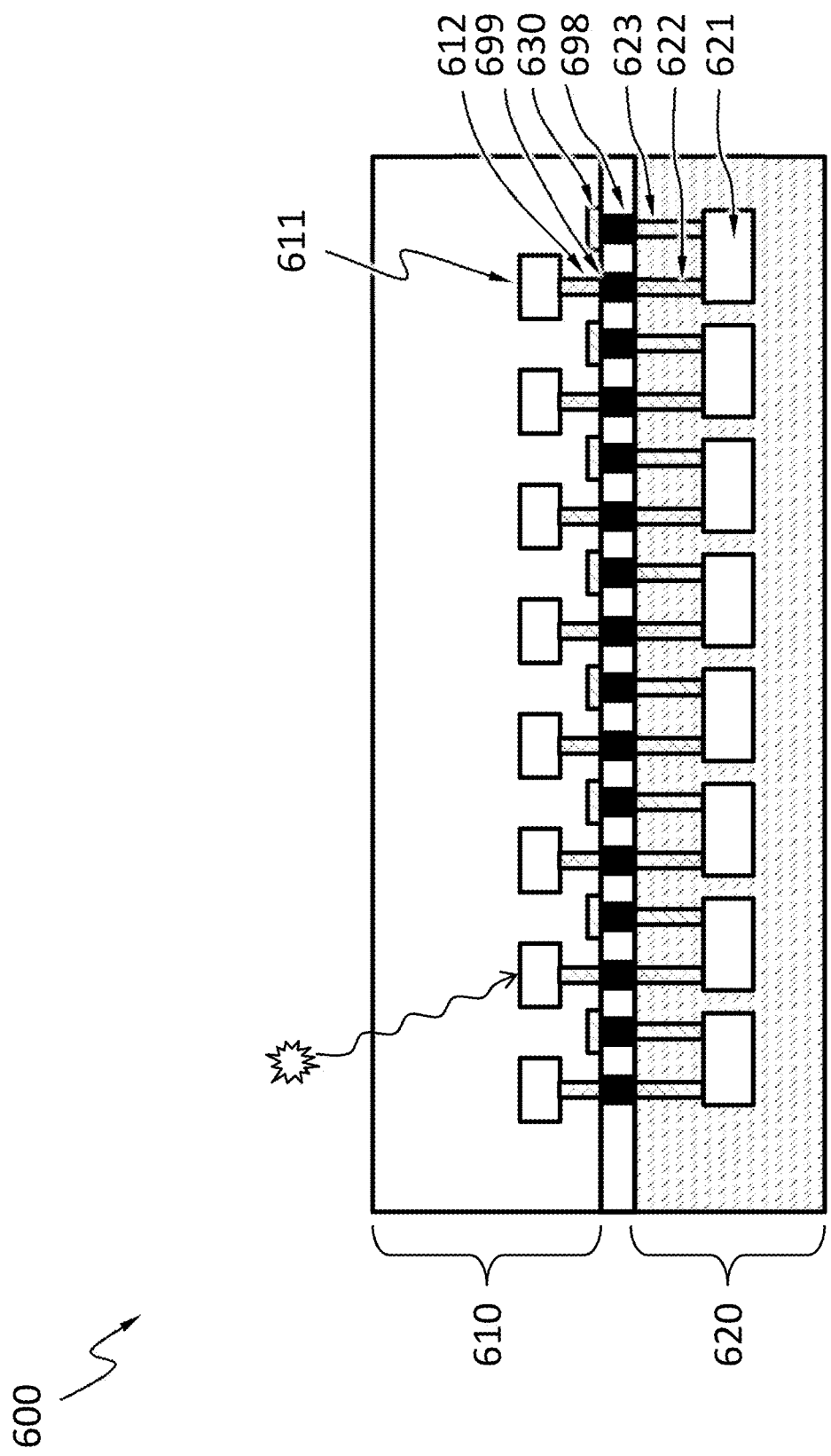

FIG. 6A and FIG. 6B schematically show a cross-sectional view of an image sensor 600 comprising a plurality of APDs 611. The APDs 611 may be fabricated in a substrate 610 (e.g., a semiconductor wafer). One or more vias 612 may be present in the substrate 610 and the vias 612 electrically connect the APDs 611 to a surface of the substrate 610. Alternatively, the APDs 611 may be disposed on the surface of the substrate 610 such that electrical contacts on the APDs 611 are exposed to the surface. The substrate 610 may include transmission lines 630. Electronic systems 621 that communicate and/or control the APDs 611 may be fabricated in another substrate 620. Electronic systems 621 may include controllers, bias sources, switches, current meters, memories, amplifiers or other suitable components. Some components of the electronic systems 621 may be fabricated in the substrate 610. Electronic systems 621 may be configured to use the APDs 611 using the method illustrated in FIG. 3. One or more vias 622 and 623 may be present and electrically connect the electronic systems 621 to a surface of the substrate 620. Alternatively, the electronic systems 621 may be disposed at the surface of the substrate 620 such that electrical contacts on the electronic systems 621 are exposed to the surface. The substrates 610 and 620 may be bonded by a suitable substrate bonding technique, such as flip chip bonding or direct bonding.

As shown in FIG. 6A and FIG. 6B, flip chip bonding uses solder bumps 699 and 698 deposited onto the surface of either one of the substrates 610 and 620. Either of the substrates 610 and 620 is flipped over and the APDs 611 and the electronic systems 621 are aligned (e.g., through the vias 612, 622 or both). The substrates 610 and 620 are brought into contact. The solder bumps 699 may be melted to electrically connect the APDs 611 and the electronic systems 621. The solder bumps 698 may be melted to electrically connect the electronic systems 620 to the transmission lines 630. The transmission lines 630 configured to transmit data, power and/or signals to and from the electronic systems 621, and through which to and from the APDs 611. Any void space among the solder bumps 599 and 698 may be filled with an insulating material.

Figure 7:
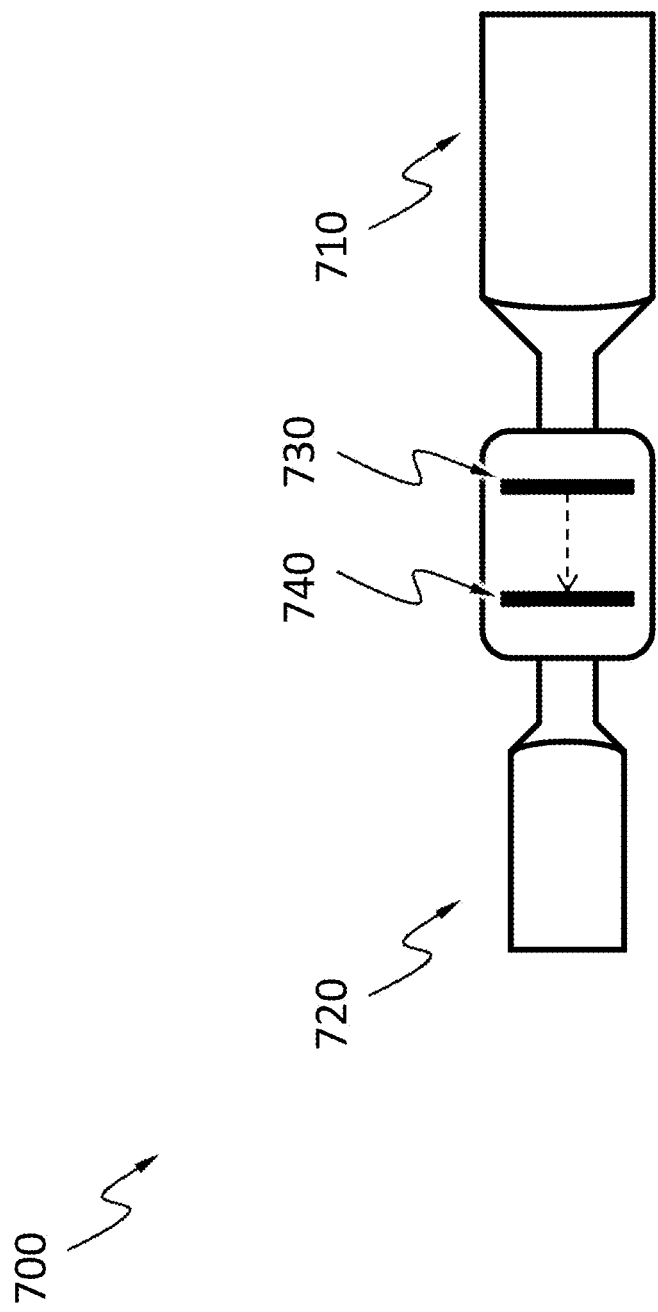
FIG. 7 schematically shows a night vision telescopic sight comprising an image sensor disclosed herein.

FIG. 7 schematically shows a night vision telescopic sight 700 comprising an image sensor 730 disclosed herein (e.g., image sensors 400, 500 or 600). The sight 700 includes one or more optical (refractive or reflective) components 710 that project a scene onto the image sensor 730. The image sensor 730 generates electronic signals representing the scene. The electronic signals are transmitted to a display 740. The display 740 displays an image based on the electronic signals. The sight 700 may include one or more optical (refractive or reflective) components 720 configured to project the image to a person using the sight.

Figure 8:
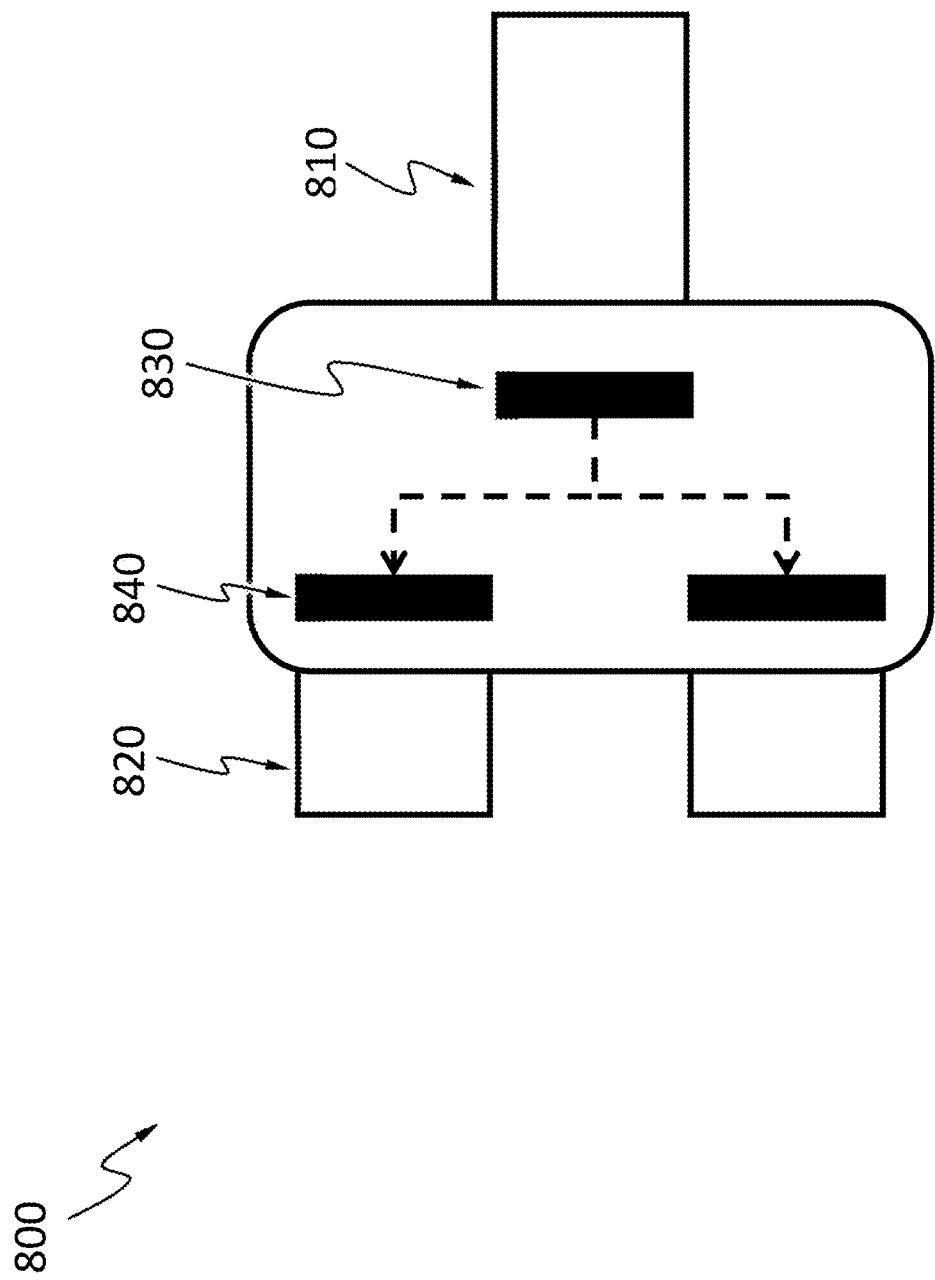
FIG. 8 schematically shows a pair of night vision goggles comprising an image sensor disclosed herein.

FIG. 8 schematically shows a pair of night vision goggles 800 comprising an image sensor 830 disclosed herein (e.g., image sensors 400, 500 or 600). The goggles 800 include one or more optical (refractive or reflective) components 810 that project a scene onto the image sensor 830. The image sensor 830 generates electronic signals representing the scene. The electronic signals are transmitted to one or two displays 840. Each of the displays 840 displays an image based on the electronic signals. The goggles 800 may include one or more optical (refractive or reflective) components 820 configured to project the image to a person using the goggles.

Figure 9:
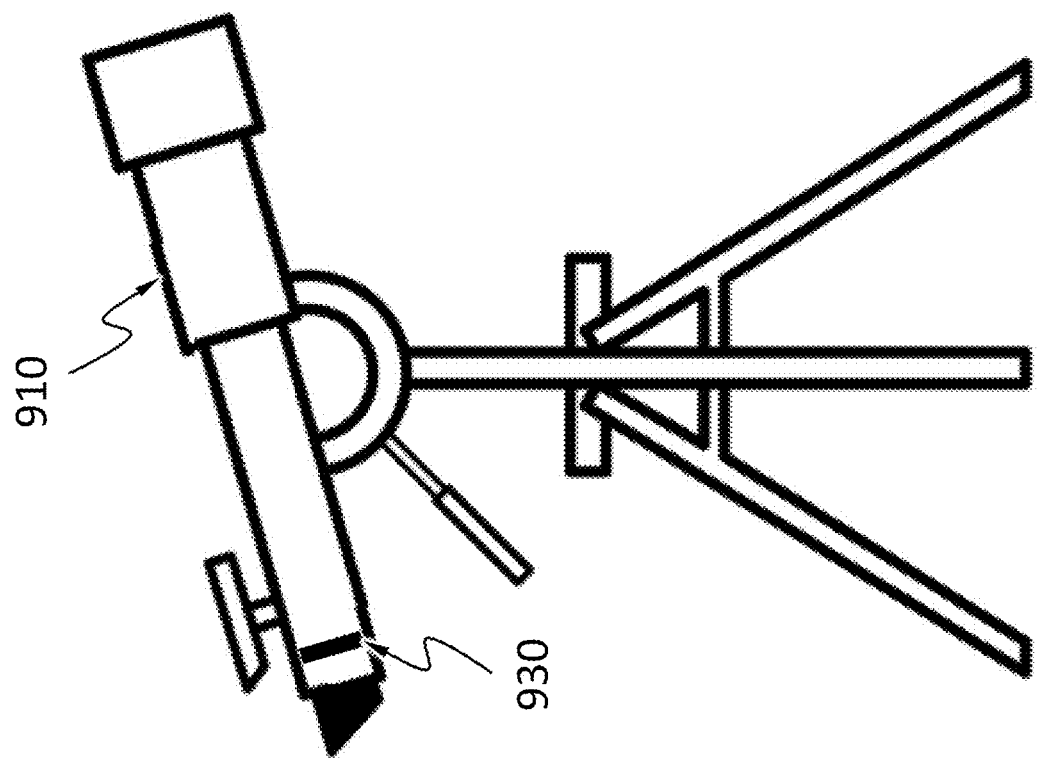
FIG. 9 schematically shows a telescope comprising an image sensor disclosed herein.

FIG. 9 schematically shows a telescope 900 comprising an image sensor 930 disclosed herein (e.g., image sensors 400, 500 or 600). The telescope 900 includes one or more optical (refractive or reflective) components 910 that project a scene onto the image sensor 930. The image sensor 930 generates electronic signals representing the scene. The electronic signals are transmitted to one or two displays and/or captured for analysis.

A spectrometer can include an image sensor disclosed herein (e.g., image sensors 400, 500 or 600). The spectrometer uses a prism or a grating to spread the light from a scene into a spectrum. The spectrum can be projected to the image sensor for detection.

A vehicle (e.g., land vehicle, space vehicle, aerial vehicle, water surface vehicle) may include an image sensor disclosed herein (e.g., image sensors 400, 500 or 600).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A system comprising:
   an avalanche photodiode (APD);
   a bias source configured to supply a reverse bias to the APD;
   a current meter configured to measure electric current through the APD;
   a controller configured to cause the APD to operate in a linear mode by reducing the reverse bias to a value below a breakdown voltage of the APD from a value above the breakdown voltage when an intensity of light incident on the APD is above a threshold, and configured to determine the intensity of the light above the threshold based on the electric current through the APD when the reverse bias is below the breakdown voltage.

2. The system of claim 1, wherein the controller is configured to quench the APD after the controller detects a rising edge in the electric current, when the reverse bias is above the breakdown voltage.

3. The system of claim 2, wherein the controller is configured to increase the reverse bias to above the breakdown voltage after quenching the APD.

4. The system of claim 1, wherein the controller is configured to determine the intensity of light incident on the APD based on a number of pulses in the electric current in a given amount of time, when the reverse bias is above the breakdown voltage.

5. The system of claim 1, wherein the threshold is a saturation intensity of the APD operating in a Geiger mode.

6. A method of using an APD, comprising:
   (a) applying a first reverse bias above a breakdown voltage of the APD to the APD;
   (b) measuring a first intensity of light incident on the APD;
   (c) determining whether the first intensity is above a first threshold;
   if the first intensity is not above the first threshold, repeating (a)-(c);

if the first intensity is above the first threshold:
(d) applying a second reverse bias below the breakdown voltage to the APD;
(e) measuring a second intensity of light incident on the APD;
(f) determining whether the first intensity is below a second threshold;
if the second intensity is not below the second threshold, repeating (d)-(f);
if the second intensity is below the first threshold, performing (a)-(c).

7. The method of claim 6, wherein measuring a first intensity comprises counting a number of current pulses through the APD in a giving amount of time.

8. The method of claim 6, wherein measuring a second intensity comprises measuring an electric current in the APD.

9. The method of claim 6, wherein the first threshold is a saturation intensity of the APD.

10. The method of claim 6, wherein the first and second thresholds are the same.

* * * * *